United States Patent [19]

Walls

[11] 4,355,096

[45] Oct. 19, 1982

[54] PROCESS FOR HEATING EXPOSED AND DEVELOPED LIGHT-SENSITIVE LITHOGRAPHIC PRINTING PLATES WITH CARBOXYLIC ACID AND AMINE MOIETY CONTAINING COMPOUNDS ON SURFACE THEREOF

[75] Inventor: John E. Walls, Annandale, N.J.

[73] Assignee: American Hoechst Corporation, Somerville, N.J.

[21] Appl. No.: 167,615

[22] Filed: Jul. 11, 1980

[51] Int. Cl.$^3$ ............................ G03F 7/08; G03F 7/10
[52] U.S. Cl. ...................................... 430/302; 430/309; 430/330; 430/331; 101/456; 101/467
[58] Field of Search .............. 430/302, 309, 330, 331; 101/456, 467

[56] References Cited

U.S. PATENT DOCUMENTS

| | | | |
|---|---|---|---|
| 3,046,121 | 7/1962 | Schmidt | 96/33 |
| 3,315,600 | 4/1967 | Tomanek | 430/49 |
| 4,062,682 | 12/1977 | Laridon et al. | 430/204 |
| 4,063,507 | 12/1977 | Toyama et al. | 430/146 |
| 4,191,570 | 3/1980 | Herting et al. | 430/302 |
| 4,208,212 | 6/1980 | Kuzuwata et al. | 101/467 |

FOREIGN PATENT DOCUMENTS

| | | |
|---|---|---|
| 275916 | 3/1966 | Australia . |
| 2855393 | 7/1980 | Fed. Rep. of Germany . |
| 1151199 | 5/1969 | United Kingdom ............... 101/456 |
| 1513368 | 6/1978 | United Kingdom . |
| 1555233 | 11/1979 | United Kingdom . |

OTHER PUBLICATIONS

Noller, C. R., "Textbook of Organic Chemistry", 2nd Ed., 1958, p. 185.
Kirk–Othmar, "Encyclopedia of Chemical Technology", 2nd Ed., 1963, vol. 6, p. 6–7, vol. 7, p. 27 and vol. 19, p. 513.

Primary Examiner—Charles L. Bowers
Attorney, Agent, or Firm—Richard S. Roberts

[57] ABSTRACT

A process for producing a lithographic printing plate is disclosed which comprises exposing and developing a photographic element, coating the element with one or more carboxylated amines or the salts thereof, and subsequently baking the element.

6 Claims, No Drawings

PROCESS FOR HEATING EXPOSED AND DEVELOPED LIGHT-SENSITIVE LITHOGRAPHIC PRINTING PLATES WITH CARBOXYLIC ACID AND AMINE MOIETY CONTAINING COMPOUNDS ON SURFACE THEREOF

BACKGROUND OF THE INVENTION

The present invention relates to a process for producing planographic printing plates, or more particularly, to a method for producing planographic printing plates comprising subjecting light sensitive planographic printing plate members, usually having metal as a support, to a burning-in heat treatment.

Positive type light sensitive planographic printing plates are usually produced by coating an o-quinone diazide type light sensitive material, either alone or in combination with appropriate additives, on a support such as a metal, plastic, or the like. After exposing this light sensitive printing plate to active rays through a transparent positive, the o-quinone diazide light sensitive material decomposes at the exposed areas and becomes alkali soluble. Thus it is easily removed with an aqueous alkali solution, thereby providing a positive image on the support.

Where a support with a surface which is hydrophilic or has been previously treated to render the same hydrophilic is used, the areas removed by an aqueous alkali developing solution expose the hydrophilic layer, which will receive water and repel ink. On the other hand, the areas remaining as an image are oleophilic and accept ink. As negative type light sensitive compositions, diazonium salts, azide compounds, or photopolymerizable compounds are often used. These light sensitive materials are coated, alone or in combination with appropriate additives, on a support to form negative working printing plates.

In this case, where a support with a surface which is hydrophilic or has been previously treated to render the same hydrophilic is used, unexposed areas are removed with a developer, thus uncovering the hydrophilic layer which will receive water, and repel ink. On the other hand, the areas which have hardened upon exposure to light and remain as an image at development are oleophilic and receive ink.

It has been known in the lithographic art to increase press life capabilities of offset plate systems by up to tenfold when said plates are subjected to elevated heating after exposure and development. Cross-linking of the polymeric image areas occurs under heating conditions thus resulting in virtually complete solvent insolubility, increased abrasion resistance, and a vastly increased press life.

This heating which is generally called a burning-in, is described in detail in British Pat. Nos. 1,151,199 and 1,154,749 and U.S. Pat. No. 4,063,507.

The application of a burning-in makes it possible to increase the number of copies obtained with one printing plate several fold compared to the case where no burning-in treatment is used.

A characteristic side effect of the heating step is alteration of the aluminum substrate from a hydrophilic surface to one of an oleophilic type. It is believed that aluminum oxides present at the interface undergo complex rearrangements catalyzed by high temperature environments, thus resulting in a shift of the hydrophilic/hydrophobic balance.

With printing plates produced by conventional plate-making methods, when special printing inks containing many components capable of dissolving the image on the printing plate, such as an ultraviolet ray curable ink, a low temperature drying ink, etc., are used, the image areas of the printing plate are vigorously dissolved by these inks, resulting in a marked reduction in press life as compared to the case in which an ordinary ink is used. However, the application of a burning-in makes it possible to obtain a sufficient number of copies, even using the above special printing inks, because the solvent resistance of the image areas is markedly increased.

However, when the burning-in is applied, the non-image areas of the printing plate which are hydrophilic prior to the burning-in (i.e., areas where the hydrophilic surface of the support is exposed by development) lose their hydrophilicity and tend to receive printing ink, thereby causing contamination at the background of printed matter.

To negate or reverse the hydrophobic effect created by the heating step, various additional processing steps have been introduced during the overall processing procedure by various plate manufacturers. Claims of post-treatment steps as redeveloping, plate cleaning, plate conditioning, etc., have been suggested for the above. Additionally, pre-baking processing procedures have been recommended to avoid aluminum oxide reactivity.

These steps consist of applying surfactants such as mono and didecylphenoxy benzene disulfonates or water-soluble polymers, such as polyvinyl alcohol or gums such as gum arabic or synthetic gums to the developed plate prior to burning-in. Unfortunately, these water-soluble constituents although hydrophilic initially, underto chemical change under elevated temperature themselves which nullify their desired intent.

After the burning-in, therefore, it had been required that a surface smoothening treatment to restore hydrophilicity by cleaning the non-image areas be applied.

This surface smoothening treatment is achieved by eroding the metal surface of the support with an aqueous alkali or acid solution, thereby exposing a fresh, clean surface. The alkali or acid used is selected from those compounds capable of eroding the metal surface in a short period, and fluorides such as hydrofluoric acid, hydrofluorboric acid, hydrofluosilicic acid, and the like are often used. These fluorides, however, are toxic, dangerous substances, and cause many pollution problems.

Moreover, since the application of the surface smoothening treatment erodes the metal surface of the support, and renders the surface easily scratchable and poorly durable to abrasion, it is likely that the non-image areas will lose the ability to accept water, background contamination will occur, and the printing plate will not be durable to further printing.

SUMMARY OF THE INVENTION

It has now been found that aqueous solutions of certain compounds, specifically carboxylated amines or the salts thereof preserve the hydrophilic properties of the aluminum interface when applied prior to the baking step, so that no chemical treatment of the plate is required after the burning-in procedure. These compounds form adequate film forming layers so as to prevent oxygen from entering the aluminum surface during the elevated temperature environment, thus inhibiting complex oxide rearrangements.

It is therefore, an object of the present invention to achieve the benefit of elongated press run capability from a printing plate by means of a burning-in treatment whereby no subsequent chemical processing is repaired.

It is another object of the present invention to prevent background contamination caused by a burning-in which otherwise renders such background oleophilic.

These and other objects of the present invention will be in part discussed and in part apparent upon a consideration of the detailed description of the preferred embodiment.

DETAILED DESCRIPTION OF THE PREFERRED EMBODIMENT

As heretofore mentioned, the instant invention teaches a method of producing an extremely long running lithographic printing plate by means of applying an aqueous solution of one or more carboxylated amines to the surface of an exposed and developed plate with a subsequent burning-in treatment.

In a preferred embodiment, a lithographic printing plate is first constructed by applying a light sensitive composition to a substrate. This composition preferably comprises a diazo compound, usually an O-quinone diazide in admixture with an oleophilic resin such as a phenol formaldehyde resin. Negative working diazo compounds and photopolymerizable compounds may also be used. The composition may optionally contain colorants such as dyes or pigments, fillers, U.V. stabilizers and other additives which are well-known in the art. Typical substrates include metals, preferably aluminum which may have undergone such surface treatments as graining, etching, anodizing or sealing and may have been rendered hydrophilic by having its surface coated with such agents as sodium silicate, hydrofluozirconic acid or potassium zirconium fluoride, polyvinyl phosphonic acid and the like.

The thusly produced plate is then exposed and developed via a method well-known in the art. This may include exposure to ultraviolet radiation through a photographic mask and development with an aqueous alkali developer.

In accordance with the present invention, the developed printing plate is now coated with an aqueous solution of one or more carboxylated amines or the salts thereof and subjected to a baking treatment. The heat causes the cross-linking of the image forming resins remaining on the plate after development thus strengthening the image. The amine protects the hydrophilic non-image area during baking and prevents these areas from becoming oleophilic.

Examples of the amines useful for this invention are ethylene diamine tetra acetic acid, hydroxyl ethyl ethylene diamine tri-acetic acid, diethylene tri-amine penta-acetic acid, nitrilo tri-acetic acid or the sodium, potassium, lithium, calcium or magnesium salts thereof. Such carboxylated amines may be employed in and of themselves or may be attached to aliphatic compounds having from 2 to 8 carbon atoms. Optionally the amines of the present invention may be admixed with acids such as sulfuric, nitric, phosphoric, acetic, citric or tartaric acids. When this is done the acid abstracts the cation from the carboxyl group and replaces it with a hydrogen from the acid thus forming an amine carboxylic acid. The cation then may react with the ionic acid to form a complex salt. For example, if ethylene diamine tetra acetic acid tetra sodium salt is admixed with phosphoric acid, a reaction takes place whereby one or two sodium cations are replaced by hydrogen on the amine and the sodium cation reacts with the phosphoric acid anion to form a monosodium phosphate. The coating composition of the present invention would then comprise an admixture of this amine carboxylic acid and monosodium phosphate.

The solid ingredients of this composition are applied to the printing plate via an aqueous solution usually having a concentration of from about 0.1 to 40% by weight preferably up to 15% and most preferably up to 7%. The usual pH of this composition ranges from about 2.5 to 9.0.

In a typical embodiment, the pre-treating agent of the present invention is merely coated on a printing plate at room temperature, at atmosphere pressure, and then dried. No substantial detrimental influence is exerted on the successful practice of the present invention by varying the coating temperature, drying temperature or drying time. Good results are obtained when the pre-treating agents of the present invention are coated in a dry amount of about 10 mg/m$^2$ or more; typically, the minimal amount required to obtain acceptable results would be utilized in order to lower material costs. The minimal amount required can easily be determined by one skilled in the art.

As one method of applying the burning pre-treating agent, the surface of the printing plate is rubbed with a sponge or absorbent cotton soaked with the pre-treating agent, or the printing plate is dipped in a tray filled with the pre-treating agent, or a like method can be used. Rendering the coating of the pre-treating agent smooth by, e.g. squeegeeing after the coating thereof, provides preferred results.

The thusly coated plate is then baked in a oven for up to about 45 minutes at a temperature of from about 250° F. to 510° F. More usual baking times range from 2 to 10 minutes. This baking is normally carried out in an oven specially produced for heating printing plates. One such oven is an Encoven® available from the Azoplate Division of American Hoechst Corporation.

The following examples serve as non-limiting demonstrations of the operation of the instant invention.

EXAMPLE 1

The following composition was coated and dried on a grained and anodized sheet of lithographic aluminum. All parts are by weight.

| | |
|---|---|
| Formvar 12/85 (Polyvinyl formal resin) | 5% |
| Hostaperm B2G Pigment (Cyanophthalate) | 3% |
| Negative acting diazo photosensitive resin | 2% |
| Phosphoric acid | .3% |
| Methyl Cellosolve | Balance |
| | 100% |

The plate thusly produced was exposed and developed by a method well-known in the art and cut into two samples. Sample 1 was placed on a printing press and produced 70,000 acceptable reproductions before image breakdown. Sample B was coated with a 7% aqueous solution of ethylene diamine tetra acetic acid sodium salt, dried, and baked for 5 minutes at 300° F. After cooling, the plate was run on a printing press and produced 200,000 acceptable copies prior to image breakdown. No processing was required to remove the protective film after baking. High quality impressions were produced after only 12 waste copies were printed. The image areas of the reproductions were totally inked and there were no spots or toning in the background areas.

EXAMPLE 2

The following composition was coated on a grained sheet of lithographic grade aluminum and dried. All parts are by weight.

| | |
|---|---|
| Positive acting light sensitive diazide | 10% |
| Crystal Violet | .2% |
| Phenol formaldehyde resin | 9% |
| Butyl acetate | 30% |
| Ethyl Cellosolve Acetate | Balance |
| | 100% |

The thusly produced plate was then exposed through a positive transparency, developed with an aqueous alkali developer by a method well-known in the art and cut into two samples. Sample 1 was placed on a printing press and produced 60,000 acceptable reproductions before image breakdown. Sample 2 was coated with a 7% aqueous solution of the following composition and dried. Parts are by weight.

Ethylene diamine tetra acetic acid tetra sodium salt—3.556 parts
Hydroxyethyl ethylene diamine tri-acetic acid tri-sodium salt—3.556 parts
85% phosphoric acid—5.173 parts The coated plate was then baked in an oven for 7 minutes at 275° F. and placed on a printing plate. 400,000 acceptable reproductions were made before image breakdown.

While the invention has been described in detail and with reference to specific embodiments thereof, it will be apparent to one skilled in the art that various changes and modifications can be made therein without departing from the spirit and scope thereof.

What is claimed is:

1. A process for producing a lithographic printing plate comprising exposing and developing a light sensitive printing plate sensitized by a composition containing a compound selected from the group consisting of o-quinone diazides, diazonium salts, azide compounds, or photopolymerizable compounds; coating the exposed and developed surface of said plate with an aqueous solution of a composition comprising one or more compounds selected from the group consisting of ethylene diamine tetra acetic acid, hydroxyethyl ethylene diamine tri-acetic acid, diethylene tri-amine penta-acetic acid, nitrilo tri-acetic acid or the sodium, potassium, lithium, calcium or magnesium salts thereof, or any of the preceding compounds which are attached to an aliphatic compound comprising 2 to 8 carbon atoms or the sodium, potassium, lithium, calcium or magnesium salts thereof and then subjecting said coated plate to a burning-in treatment.

2. The process of claim 1 wherein said amine is attached to an aliphatic compound comprising from 2 to 8 carbon atoms.

3. The process of claim 1, or 2 wherein said composition further comprises one or more acids.

4. The process of claim 1, or 2, wherein said composition further comprises one or more acids selected from the group consisting of phosphoric, nitric, acetic, citric, tartaric or sulfuric acids.

5. The process of claim 1 wherein said burning-in treatment comprises baking said plate in an oven at a temperature of from 250° F. to 510° F. for up to 10 minutes.

6. The process of claim 1 wherein said solution has a pH of from 2.5 to 9.0.

* * * * *